United States Patent
Lien et al.

(10) Patent No.: US 6,215,708 B1
(45) Date of Patent: Apr. 10, 2001

(54) CHARGE PUMP FOR IMPROVING MEMORY CELL LOW VCC PERFORMANCE WITHOUT INCREASING GATE OXIDE THICKNESS

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/164,450

(22) Filed: Sep. 30, 1998

(51) Int. Cl.[7] .............................. G11C 16/04; G11C 7/00
(52) U.S. Cl. ....................................... 365/189.09; 365/226
(58) Field of Search .......................... 365/189.09, 189.11, 365/226, 230.06, 230.03, 189.06; 327/535, 536, 537, 538, 539, 540, 541; 371/67.1; 707/10

(56) References Cited

U.S. PATENT DOCUMENTS

| | | |
|---|---|---|
| 4,797,899 | 1/1989 | Fuller et al. . |
| 4,868,416 * | 9/1989 | Fitzpatrick et al. ................. 323/313 |
| 5,073,731 | 12/1991 | Oh . |
| 5,149,994 * | 9/1992 | Neu ..................................... 327/538 |
| 5,206,942 * | 4/1993 | Ibi ............................................ 711/5 |
| 5,267,209 | 11/1993 | Yoshida . |
| 5,335,205 * | 8/1994 | Ogihara ........................... 365/189.09 |
| 5,347,171 | 9/1994 | Cordoba et al. . |
| 5,361,237 * | 11/1994 | Chishiki ........................... 365/189.09 |
| 5,398,207 * | 3/1995 | Tsuchida et al. ..................... 365/226 |
| 5,404,330 * | 4/1995 | Lee et al. ........................ 365/189.11 |
| 5,414,669 | 5/1995 | Tedrow et al. . |
| 5,422,590 | 6/1995 | Coffman et al. . |
| 5,442,586 | 8/1995 | Javanifard et al. . |
| 5,453,953 * | 9/1995 | Dhong et al. ......................... 365/226 |
| 5,532,915 | 7/1996 | Pantelakis et al. . |
| 5,537,362 | 7/1996 | Gill et al. . |
| 5,563,499 | 10/1996 | Pinney . |
| 5,587,956 * | 12/1996 | Tanida ............................. 365/189.09 |
| 5,590,159 * | 12/1996 | Anderson ............................ 371/67.1 |
| 5,610,863 * | 3/1997 | Yamada ........................... 365/189.09 |
| 5,610,869 * | 3/1997 | Yoo et al. ........................ 365/189.09 |
| 5,627,796 | 5/1997 | Park et al. . |
| 5,633,832 | 5/1997 | Patel et al. . |
| 5,642,315 * | 6/1997 | Yamaguchi ..................... 365/189.09 |
| 5,672,992 | 9/1997 | Nadd . |
| 5,673,225 | 9/1997 | Jeong et al. . |
| 5,680,349 | 10/1997 | Atsumi et al. . |
| 5,689,208 | 11/1997 | Nadd . |
| 5,694,308 | 12/1997 | Cave . |
| 5,710,741 | 1/1998 | McLaury . |
| 5,715,199 | 2/1998 | Kim . |
| 5,726,944 * | 3/1998 | Pelley, III et al. .................... 365/226 |

(List continued on next page.)

Primary Examiner—Trong Phan
(74) Attorney, Agent, or Firm—Bever, Hoffman & Harms, LLP

(57) ABSTRACT

A memory circuit that operates in response to a $V_{CC}$ supply voltage and a ground voltage is provided. The memory circuit includes a word line voltage generation circuit that generates a fixed word line voltage. The fixed word line voltage is selectively applied to word lines of the memory circuit. The word line voltage generation circuit generates the fixed word line voltage for all values of the $V_{CC}$ supply voltage between the minimum $V_{CC}$ supply voltage and the maximum $V_{CC}$ supply voltage. The fixed word line voltage is referenced to the ground voltage, rather than the $V_{CC}$ supply voltage. Because the ground voltage does not vary, the boosted word line voltage of the present invention can be controlled more precisely than prior art boosted word line voltages, which are referenced to the $V_{CC}$ supply voltage. This improved control enables the boosted word line voltage to be fixed for the entire range of the $V_{CC}$ supply voltage. This improved control also enables the boosted word line voltage to be selected to optimize the operating and design characteristics of the memory circuit.

14 Claims, 14 Drawing Sheets

U.S. PATENT DOCUMENTS

| | | | |
|---|---|---|---|
| 5,754,418 | | 5/1998 | Park et al. . |
| 5,822,267 | * | 10/1998 | Watanabe et al. ............... 365/189.09 |
| 5,841,705 | * | 11/1998 | Hamamoto et al. ............ 365/189.09 |
| 5,841,706 | * | 11/1998 | Umezaki et al. ................ 365/189.09 |
| 5,841,725 | * | 11/1998 | Kang et al. ...................... 365/189.09 |
| 5,842,282 | * | 12/1998 | Alley et al. ............................ 707/10 |
| 5,936,894 | * | 8/1999 | Hawkins et al. ................. 365/189.09 |

* cited by examiner

CHARGE PUMP FOR IMPROVING MEMORY CELL LOW VCC PERFORMANCE WITHOUT INCREASING GATE OXIDE THICKNESS

BACKGROUND OF THE INVENTION

1. Field of the Invention

The present invention relates to a structure and method for operating an array of memory cells. More specifically, the present invention relates to a charge pump for driving word lines of an array of memory cells.

2. Discussion of Related Art

FIG. 1 is a circuit diagram of a conventional dynamic random access memory (DRAM) cell 100. DRAM cell 100 includes n-channel transistor 101, capacitor 102, word line 103 and bit line 104. In general, data is written to DRAM cell 100 by applying a high voltage to word line 103, thereby turning on transistor 101. A voltage representative of a data value is then applied to bit line 104. In response, capacitor 102 stores a charge representative of the data value. For a logic high voltage, it is desirable for a relatively high voltage to be applied to capacitor 102. To accomplish this, a boosted word line voltage is applied to word line 103 when accessing DRAM cell 100. The boosted word line voltage has a value of 1.5 times the $V_{CC}$ supply voltage. As a result, the voltage applied to capacitor 102 is approximately equal to the $V_{CC}$ supply voltage. FIG. 2 is a graph showing the variation of the boosted word line voltage $V_{WL}$ with respect to variations in the $V_{CC}$ supply voltage.

As a general rule, the $V_{CC}$ supply voltage is allowed to vary +/-10 percent. Thus, a $V_{CC}$ voltage supply having a nominal voltage of 5 Volts can vary from 4.5 volts ($V_{CCMin}$) to 5.5 Volts ($V_{CCMax}$). If the $V_{CC}$ supply voltage has a value of 4.5 Volts, the word line voltage is boosted to 6.25 Volts, thereby enabling an adequate voltage to be applied to capacitor 102. If the $V_{CC}$ supply voltage has a value of 5.5 Volts, then the boosted word line voltage has a value of about 8.25 Volts. The gate oxide of transistor 101 must therefore be designed to handle 8.25 Volts during normal operating conditions. As a result, the required thickness of the gate oxide of transistor 101 can be relatively thick. If all of the transistors in the device implementing DRAM cell 100 are designed to have the same gate oxide thickness, then the speed of the device may be slowed down by this thicker gate oxide. Otherwise, multiple gate oxide thicknesses may be required, thereby complicating the process used to fabricate the memory array.

FIG. 3 is a circuit diagram of a static random access memory (SRAM) cell 200. SRAM cell 200 includes cross coupled n-channel transistors 201–202, n-channel access transistors 203–204, load resistors 205–206, word line 207 and bit lines 208–209. In general, SRAM cell 200 is accessed by applying a high voltage to word line 207, thereby turning on access transistors 203–204. Voltages representative of a data value are then applied to bit lines 208–209. In response, one of transistors 201–202 is turned on and the other one of transistors 201–202 is turned off. The word line voltage is then de-asserted low, thereby latching a data value into transistors 201–202. One node stores a logic high voltage $V_H$, and the other node stores a logic low voltage $V_L$. In some SRAM circuits, the word line voltage is pumped to a voltage equal to $V_{CC}$+1 volt, such that the voltage $V_H$ is equal to $V_{CC}$+1 Volts–$V_{tb}$, where $V_{tb}$ is the back bias voltage applied to access transistor 203 (or 204). Because $V_{tb}$ is typically about 1.5 volts, the voltage $V_H$ is equal to $V_{CC}$ –0.5 Volts. FIG. 4 is a graph illustrating the variation of the boosted word line voltage $V_{WL}$ for variations in the $V_{CC}$ supply voltage.

Again, the $V_{CC}$ supply voltage can vary +/-10 percent, between 4.5 volts ($V_{CCMin}$) and 5.5 Volts ($V_{CCMax}$). If the $V_{CC}$ supply voltage has a value of 5.5 Volts, then the boosted word line voltage has a value of about 6.5 Volts. The gate oxide of access transistors 203–204 must therefore be designed to handle 6.5 volts during normal operating conditions. As a result, the gate oxide of access transistors 203–204 must be relatively thick. If all of the transistors in the device implementing SRAM cell 200 are designed to have the same gate oxide thickness, then the speed of the device will be slowed down by this thicker gate oxide. Otherwise, multiple gate oxide thicknesses may be required, thereby complicating the process used to fabricate the memory array.

It would therefore be desirable to have a circuit which boosts the word lines high enough to improve memory access characteristics, but not so high as to require a thick gate oxide.

SUMMARY

Accordingly, the present invention provides a memory circuit that operates in response to a $V_{CC}$ supply voltage and a ground voltage. The $V_{CC}$ supply voltage varies between a minimum $V_{CC}$ supply voltage and a maximum $V_{CC}$ supply voltage during normal operating conditions of the memory circuit. The memory circuit includes a memory cell array having a plurality of word lines. The memory cells in the memory cell array can be SRAM, DRAM or read only memory (ROM) cells.

The memory circuit also includes a word line voltage generation circuit that generates a fixed word line voltage. The fixed word line voltage is selectively applied to the word lines of the memory cell array. The word line voltage generation circuit generates the fixed word line voltage for all values of the $V_{CC}$ supply voltage between the minimum $V_{CC}$ supply voltage and the maximum $V_{CC}$ supply voltage.

The fixed word line voltage is referenced to the ground voltage, rather than the $V_{CC}$ supply voltage. Because the ground voltage does not vary, the boosted word line voltage of the present invention can be controlled more precisely than prior art boosted word line voltages, which are referenced to the $V_{CC}$ supply voltage. This improved control enables the boosted word line voltage to be fixed for the entire range of the $V_{CC}$ supply voltage. This improved control also enables the boosted word line voltage to be selected to optimize the operating and design characteristics of the memory circuit. In one embodiment, the fixed word line voltage is set equal to the maximum $V_{CC}$ supply voltage. As a result, the access transistors that receive the fixed word line voltage do not need to have thicker gate oxide than the other transistors of the memory circuit. This improves the operating speed of the memory circuit, as well as simplifying the process required to fabricate the memory circuit. In other embodiments, the fixed word line voltage can be set greater than the maximum $V_{CC}$ supply voltage.

The fixed word line voltage can be referenced to the ground voltage in various manners. For example, the fixed, word line voltage can be referenced to ground by a band gap reference regulator or by a plurality of series-connected diodes.

The present invention will be more fully understood in view of the following description and drawings.

DETAILED DESCRIPTION

Figure 1:
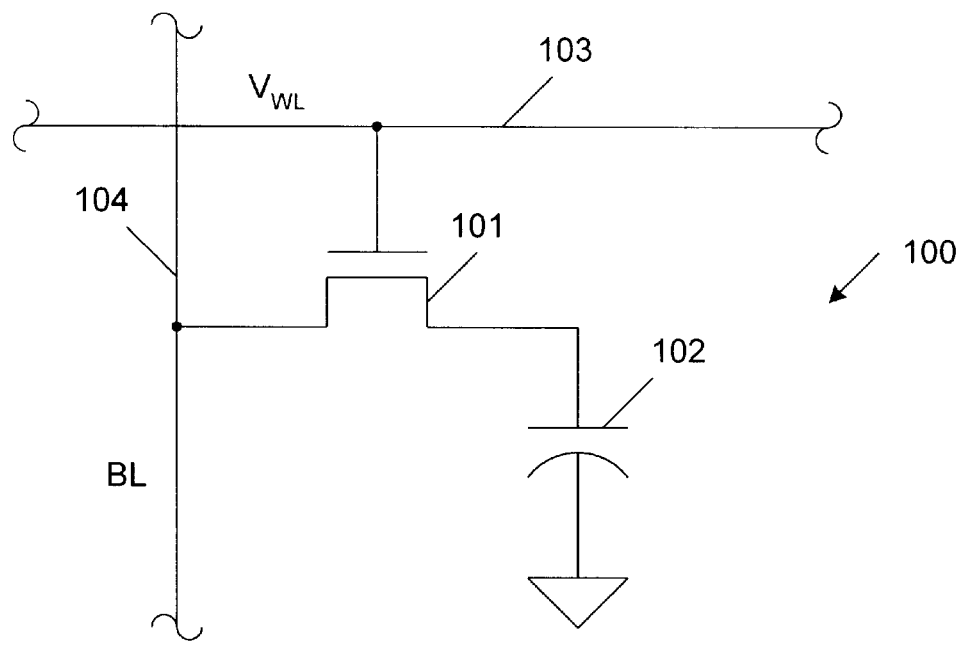
FIG. 1 is a circuit diagram of a conventional dynamic random access memory (DRAM) cell.
Figure 2:
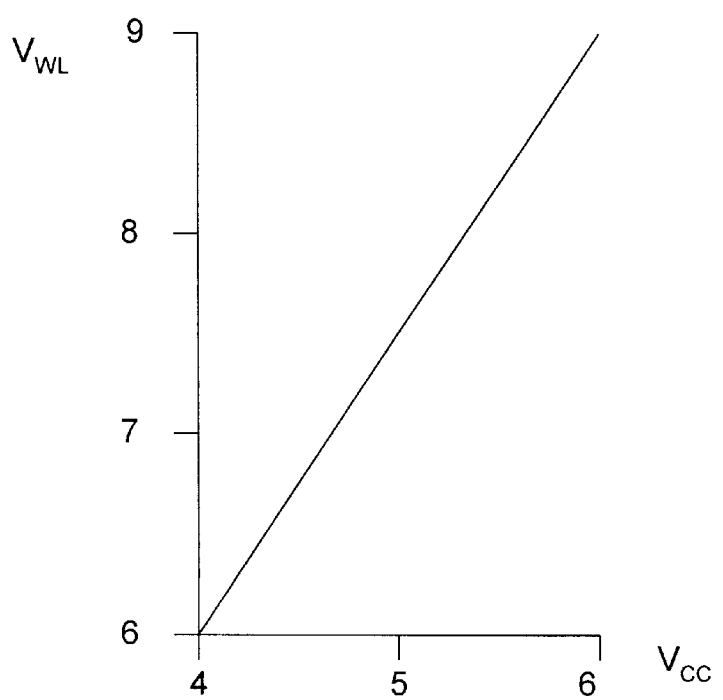
FIG. 2 is a graph showing the variation of the boosted word line voltage $V_{WL}$ with respect to the $V_{CC}$ supply voltage in the DRAM cell of FIG. 1.
Figure 3:
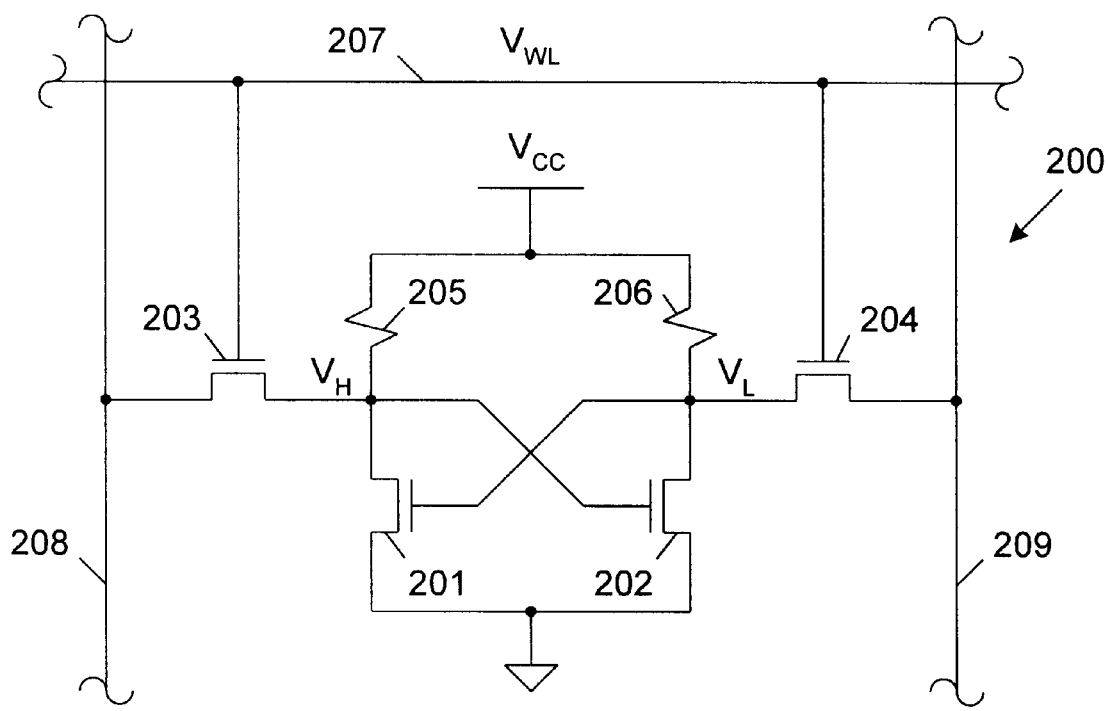
FIG. 3 is a circuit diagram of a conventional static random access memory (SRAM) cell.
Figure 4:
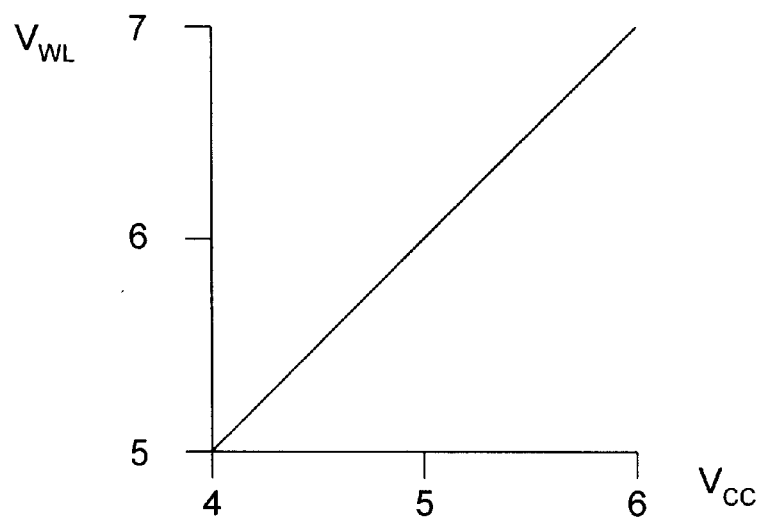
FIG. 4 is a graph illustrating the variation of the boosted word line voltage $V_{WL}$ with respect to $V_{CC}$ in the SRAM cell of FIG. 3.
Figure 5:
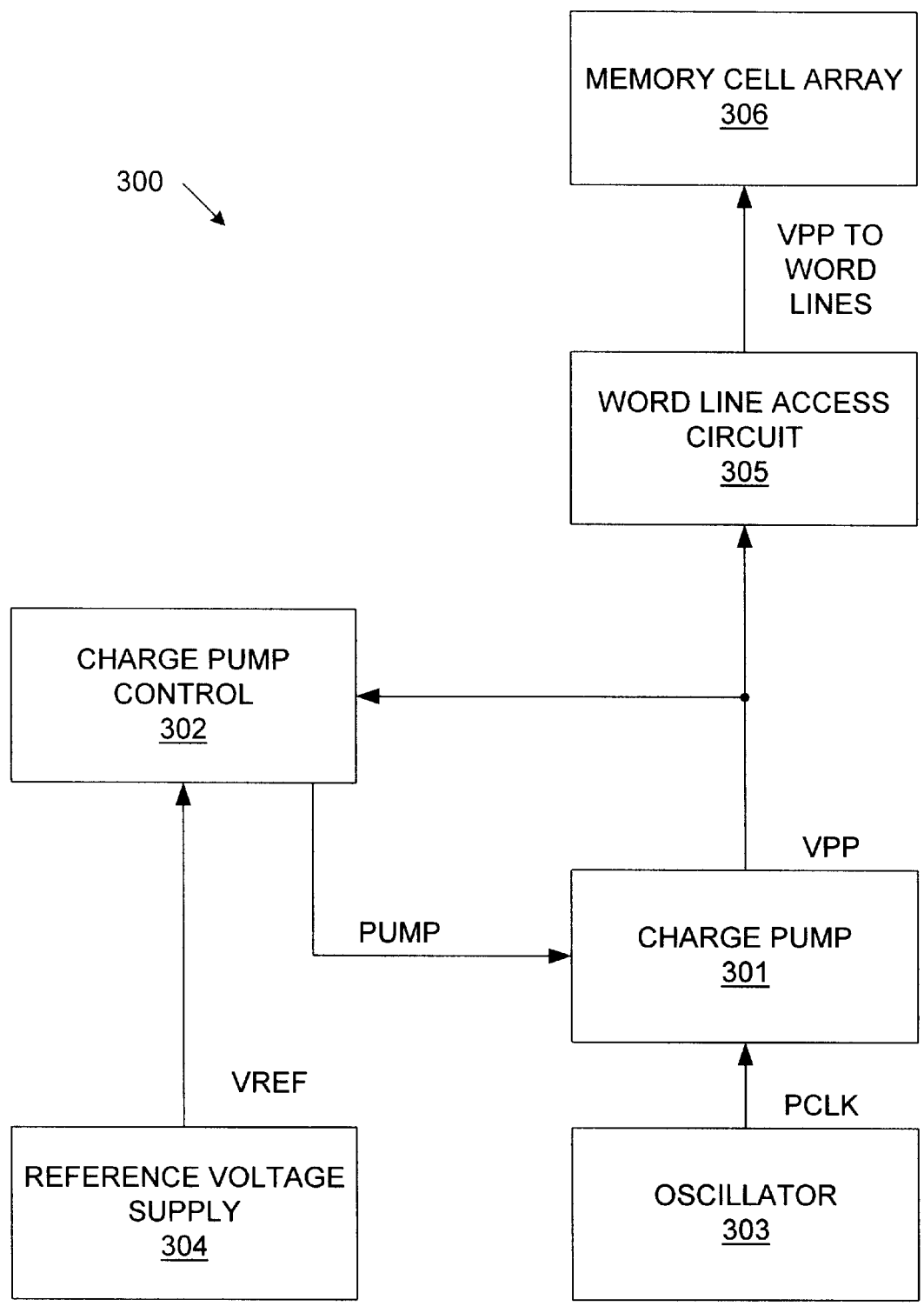
FIG. 5 is block diagram of a memory circuit in accordance with one embodiment of the present invention.

FIG. 5 is a block diagram of a memory circuit 300 in accordance with one embodiment of the present invention. Memory circuit 300 includes charge pump 301, charge pump control 302, oscillator 303, reference voltage supply 304 word line access circuit 305, and memory cell array 306. Memory cell array 306 can include an array of DRAM cells or an array of SRAM cells. In general, oscillator 303 generates a pumping clock signal (PCLK) that is provided to charge pump 301. In response to the PCLK signal, charge pump 301 generates a boosted word line voltage ($V_{PP}$). The boosted word line voltage $V_{PP}$ is provided to charge pump control circuit 302. Charge pump control circuit 302 also receives a reference voltage ($V_{REF}$) from reference voltage supply 304. As described in more detail below, reference voltage supply 304 generates the reference voltage $V_{REF}$ independent of the $V_{CC}$ supply voltage and temperature. More specifically, the reference voltage $V_{REF}$ is referenced to the ground supply voltage. In the described embodiment, the reference voltage is selected to be a predetermined fraction of the desired boosted word line voltage $V_{PP}$. In one example described below, the desired boosted word line voltage $V_{PP}$ is 3.6 Volts, and the reference voltage $V_{REF}$ is selected to be 1.2 Volts, or one third of the desired boosted word line voltage $V_{PP}$. Charge pump control 302 compares the boosted word line voltage $V_{PP}$ with the reference voltage $V_{REF}$ to determine whether the boosted word line voltage $V_{PP}$ exhibits the predetermined fractional relationship with respect to the reference voltage $V_{REF}$. When the boosted word line voltage $V_{PP}$ is less than three times the reference voltage $V_{REF}$, charge pump control 302 asserts a control signal (PUMP) that causes charge pump 301 to increase the boosted word line voltage $V_{PP}$. In this manner, charge pump 301 is controlled to generate a boosted word line voltage $V_{PP}$ that is equal to three times the reference voltage $V_{REF}$ (or 3.6 Volts). Because the reference voltage $V_{REF}$ does not vary with changes in the $V_{CC}$ supply voltage or temperature, the boosted word line voltage $V_{PP}$ can be selected to optimize the performance and design of memory circuit 300. The boosted word line voltage $V_{PP}$ is provided to word line access circuit 305, which routes the boosted word line voltage $V_{PP}$ to the addressed word lines in memory cell array 306.

In one embodiment, memory cell array 306 is an SRAM array that operates in response to a $V_{CC}$ supply voltage of 5 Volts. The reference voltage $V_{REF}$ (and thereby the boosted word line voltage $V_{PP}$) is selected to have a value that is appropriate for operating the SRAM memory cells for supply voltages within the range of $V_{CCMIN}$ to $V_{CCMAX}$. For example, the boosted word line voltage $V_{PP}$ can be selected to be equal to $V_{CCMAX}$ (or 5.5 Volts), and the reference voltage $V_{REF}$ can be selected to be one third of $V_{CCMAX}$ (or about 1.83 Volts). When the $V_{CC}$ supply voltage is near $V_{CCMIN}$ (i.e., 4.5 Volts), the boosted word line voltage $V_{PP}$ of 5.5 Volts is adequate to enable the SRAM array to operate properly. When the $V_{CC}$ supply voltage is near $V_{CCMAX}$ (i.e., 5.5 Volts), the cells of the SRAM array are more stable, thereby enabling the SRAM array to operate properly in response to a boosted word line voltage $V_{PP}$ of 5.5 volts. In another embodiment, the reference voltage $V_{PP}$ can be selected to be larger than $V_{CCMAX}$ (e.g., 6 Volts).

In another embodiment, memory cell array 306 is an SRAM array that operates in response to a $V_{CC}$ supply voltage of 3.3 volts ($V_{CCMIN}$ =3.0 Volts; $V_{CCMAX}$=3.6 Volts) In this embodiment, the boosted word line voltage $V_{PP}$ is selected to have a desired voltage of $V_{CCMAX}$ (3.6 Volts), and the reference voltage $V_{REF}$ is selected to have a voltage of one third of $V_{CCMAX}$ (or 1.2 Volts). This boosted word line voltage $V_{PP}$ allows the memory cell array to operate properly in response to both the minimum and maximum values of the $V_{CC}$ supply voltage.

In yet another embodiment, memory cell array 306 is a DRAM array that operates in response to a $V_{CC}$ supply voltage of 5 Volts. In this embodiment, the boosted word line voltage $V_{PP}$ and the reference voltage $V_{REF}$ are selected to have values that allow the DRAM cells to operate properly when the $V_{CC}$ supply voltage is within the range of $V_{CCMIN}$ to $V_{CCMAX}$. For example, boosted word line voltage $V_{PP}$ can be selected to have a value of 6.25 Volts.

Because the boosted word line voltage $V_{PP}$ is limited to a value which is less than prior art boosted word line voltages, the access transistors of the memory cells do not require as thick a gate oxide as prior art access transistors. Consequently, the speed of the circuitry fabricated on the same chip as memory cell array 306 is improved. Moreover, when the boosted word line voltage $V_{PP}$ is selected to correspond with the maximum $V_{CC}$ supply voltage $V_{CCMAX}$, the process required to fabricate memory circuit 300 is simplified because thick oxide transistors are not required.

Figure 6:
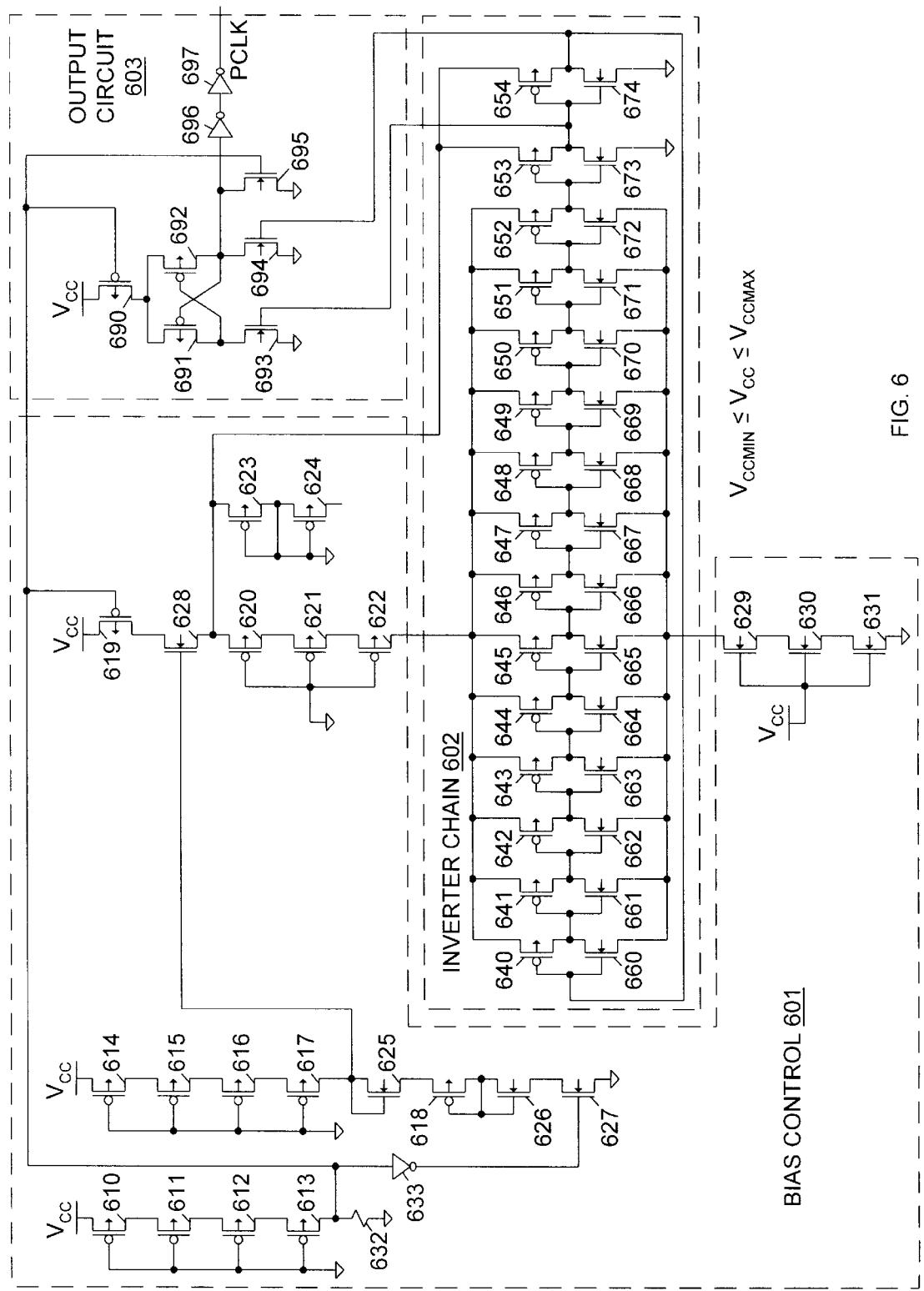
FIG. 6 is a circuit diagram of an oscillator, which is used in the memory circuit of FIG. 5 in one embodiment of the invention.

Memory circuit 300 will now be described in more detail. FIG. 6 is a circuit diagram of oscillator 303, which includes bias control circuit 601, inverter chain 602 and output circuit 603. Bias control circuit 601 includes p-channel field effect transistors (FETs) 610–624, n-channel FETs 625–631, resistor 632 and inverter 633, which are connected as illustrated.

Bias control circuit 601 provides the appropriate bias voltages to enable inverter chain 602 and output circuit 603. Bias control circuit 601 operates in response to the $V_{CC}$ supply voltage and the ground supply voltage.

Inverter chain 602 includes fifteen inverters, which are formed by p-channel FETs 640–654 and n-channel FETs 660–674. For example, the fourteenth inverter 684 is formed by p-channel FET 653 and n-channel FET 673, while the fifteenth inverter 685 is formed by p-channel FET 654 and n-channel FET 674. These fifteen inverters are connected in a ring, with the input terminal of the first inverter connected to the output terminal of the fifteenth inverter 685. Because there are an odd number of inverters in the chain, the signals provided by inverters 684 and 685 change states at a pre-determined frequency as determined by the delays exhibited by the inverters.

Output circuit 603 includes p-channel FETs 690–692, n-channel FETs 693–695 and inverters 696–697. These elements are connected as illustrated in FIG. 6. The output terminals of inverters 684 and 685 are connected to the gates of n-channel FETs 693 and 694, respectively. In response, output circuit 603 generates the pump clock signal PCLK. The pump clock signal PCLK has the same logical value as the output signal provided by the fourteenth inverter 684.

Figure 7:
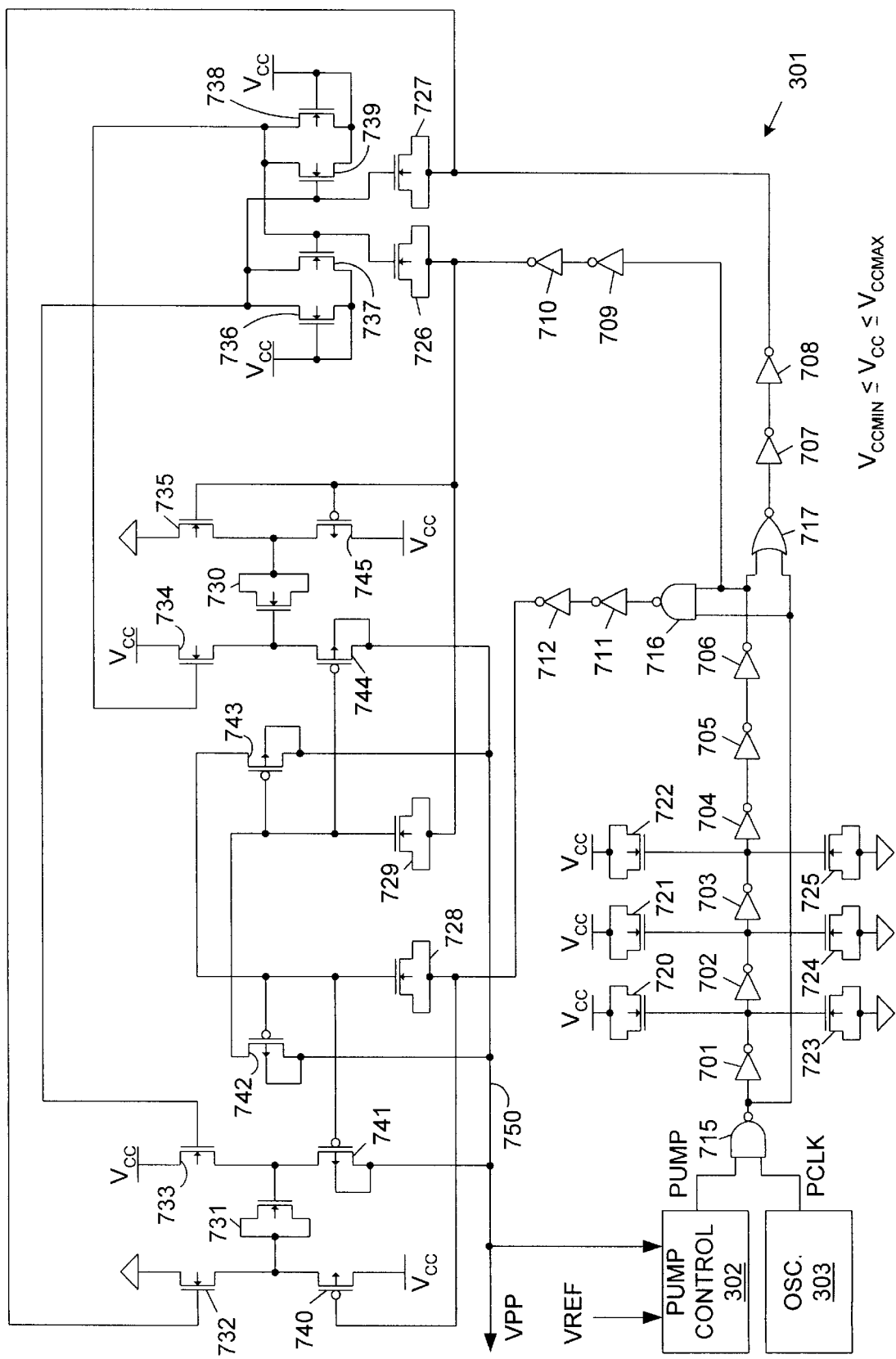
FIG. 7 is a circuit diagram of a charge pump circuit, which is used in the memory circuit of FIG. 5 in one embodiment of the invention.

FIG. 7 is a circuit diagram illustrating charge pump circuit 301, which includes inverters 701–712, NAND gates 715–716, NOR gate 717, capacitor-coupled n-channel FETs 720–731, n-channel FETs 732–739, p-channel FETs 740–745 and $V_{PP}$ bus 750.

NAND gate 715 is coupled to receive the PUMP signal from pump control circuit 302 and the PCLK signal from oscillator 303. As described above, the PCLK signal transitions between logic low and logic high states at a predetermined frequency. As described in more detail below, the PUMP signal is asserted high when pump control circuit 302 detects that the boosted word line voltage $V_{PP}$ is less than three times the reference voltage $V_{REF}$.

Charge pump 301 operates as follows. When the PUMP signal is asserted high, the PCLK signal controls charge pump 301. When the PCLK signal has a logic low value, NAND gate 715 provides a logic high output signal. This logic high signal is transmitted through inverters 701–706 and 709–710 (and capacitor-coupled n-channel FETs 726 and 729) to the gates of n-channel FETs 734–735 and 737 and the gates of p-channel FETs 743–745.

The logic high signal provided by NAND gate 715 also causes NOR gate and inverters 707–708 to provide a logic low signal to the gates of n-channel FETs 732–733 and 739. The logic high signal provided by NAND gate 715 also causes NAND gate 716 and inverters 711–712 to provide a logic low signal to the gates of p-channel FETs 740–742. As a result, n-channel FETs 734 and 735 are turned on (and p-channel FETs 744–745 are turned off), thereby charging the capacitor-coupled n-channel FET 730. At the same time, p-channel FETs 740 and 741 are turned on (and n-channel FETs 732–733 are turned off), thereby allowing the capacitor-coupled n-channel FET 731 to be coupled to VPP bus 750. Note that capacitor-coupled FET 731 was charged during a previous logic high state of the PCLK signal. As a result, capacitor-coupled FET 731 provides a boosted voltage to $V_{PP}$ bus 750.

When the PCLK signal transitions to a logic high state, the output signal provided by NAND gate 715 transitions to a logic low state. At this time, capacitor-coupled FET 730 (which was previously charged when the PCLK signal was in the logic low state) is discharged to $V_{PP}$ bus 750. Also at this time, capacitor-coupled FET 731 is charged through n-channel FETs 732 and 733.

Thus, while the PUMP signal is asserted high and the PCLK signal is in the logic low state, capacitor-coupled FET 731 discharges to $V_{PP}$ bus 750 while capacitor-coupled FET 730 charges. Conversely, while the PUMP signal is asserted high and the PCLK signal is in the logic high state, capacitor-coupled FET 731 charges while capacitor-coupled FET 730 discharges to $V_{PP}$ bus 750.

When the PUMP control signal is de-asserted low, $V_{PP}$ bus 750 is coupled to the $V_{CC}$ supply voltage terminal through p-channel FETs 740–741 and capacitor-coupled FET 731. At this time, charge pump 301 is effectively disabled, since the capacitor-coupled FETs are not charging and discharging to boost the voltage on $V_{PP}$ bus 750.

Figure 8:
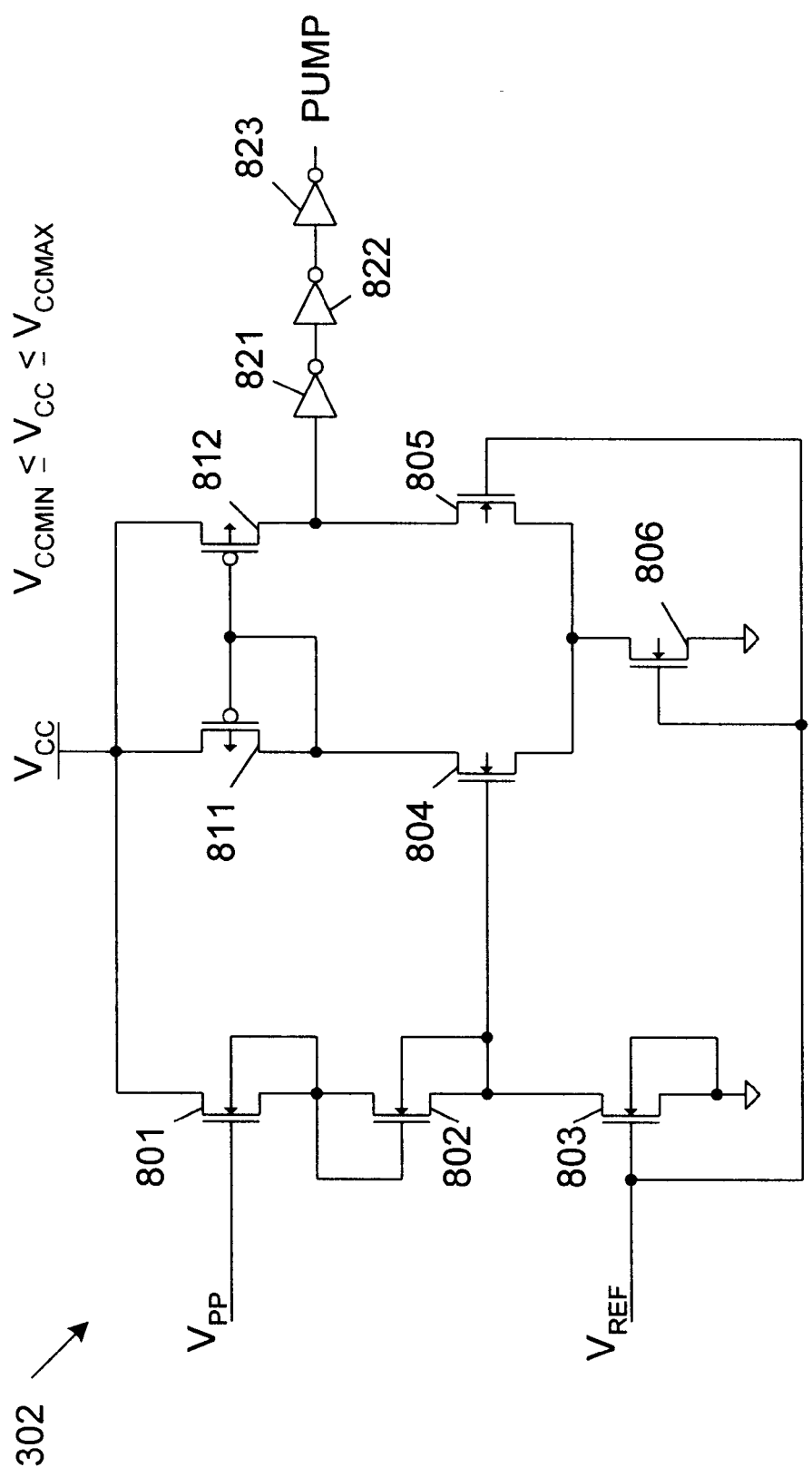
FIG. 8 is a circuit diagram of a pump control circuit, which is used in the memory circuit of FIG. 5 in one embodiment of the invention.

FIG. 8 is a circuit diagram illustrating pump control circuit 302, which includes n-channel FETs 801–806, p-channel FETs 811–812 and inverters 821–823. Pump control circuit 302 compares the $V_{PP}$ voltage provided on $V_{PP}$ bus 750 with the reference voltage $V_{REF}$ provided by reference voltage supply 304. The reference voltage $V_{REF}$ is a constant voltage that is applied to the gates of n-channel FETs 803, 805 and 806. In one embodiment, the reference voltage $V_{REF}$ is equal to 1.2 Volts and the desired $V_{PP}$ voltage is 3.6 volts. The voltage applied to the gate of n-channel FET 804 is equal to the actual $V_{PP}$ voltage minus the threshold voltages of n-channel FETs 801 and 802. In the described embodiment, n-channel FETs 801 and 802 each has a threshold voltage of 1.2 Volts. Thus, the voltage applied to the gate of n-channel FET 804 is equal to VPP minus 2.4 Volts.

If the actual $V_{PP}$ voltage is less than 3.6 Volts, the voltage applied to the gate of n-channel FET 804 is less than 1.2 Volts, and the voltage applied to the gate of n-channel FET 805 is equal to 1.2 Volts. Under these conditions, a relatively small current flows through FET 804. This small current is mirrored to FETs 811, 812 and 805. In response, the input terminal of inverter 821 is pulled low, thereby causing the PUMP signal to be asserted high.

Conversely, If the actual $V_{PP}$ voltage is greater than 3.6 Volts, the voltage applied to the gate of n-channel FET 804 is greater than 1.2 Volts, and the voltage applied to the gate of n-channel FET 805 is equal to 1.2 Volts. Under these conditions, a relatively large current flows through FET 804. This large current is mirrored to FETs 811, 812 and 805. In response, the input terminal of inverter 821 is pulled high, thereby causing the PUMP control signal to be de-asserted low.

Controlling the PUMP control signal in the above-described manner causes the actual boosted word line voltage $V_{PP}$ to be equal to 3.6 Volts.

Figure 9:
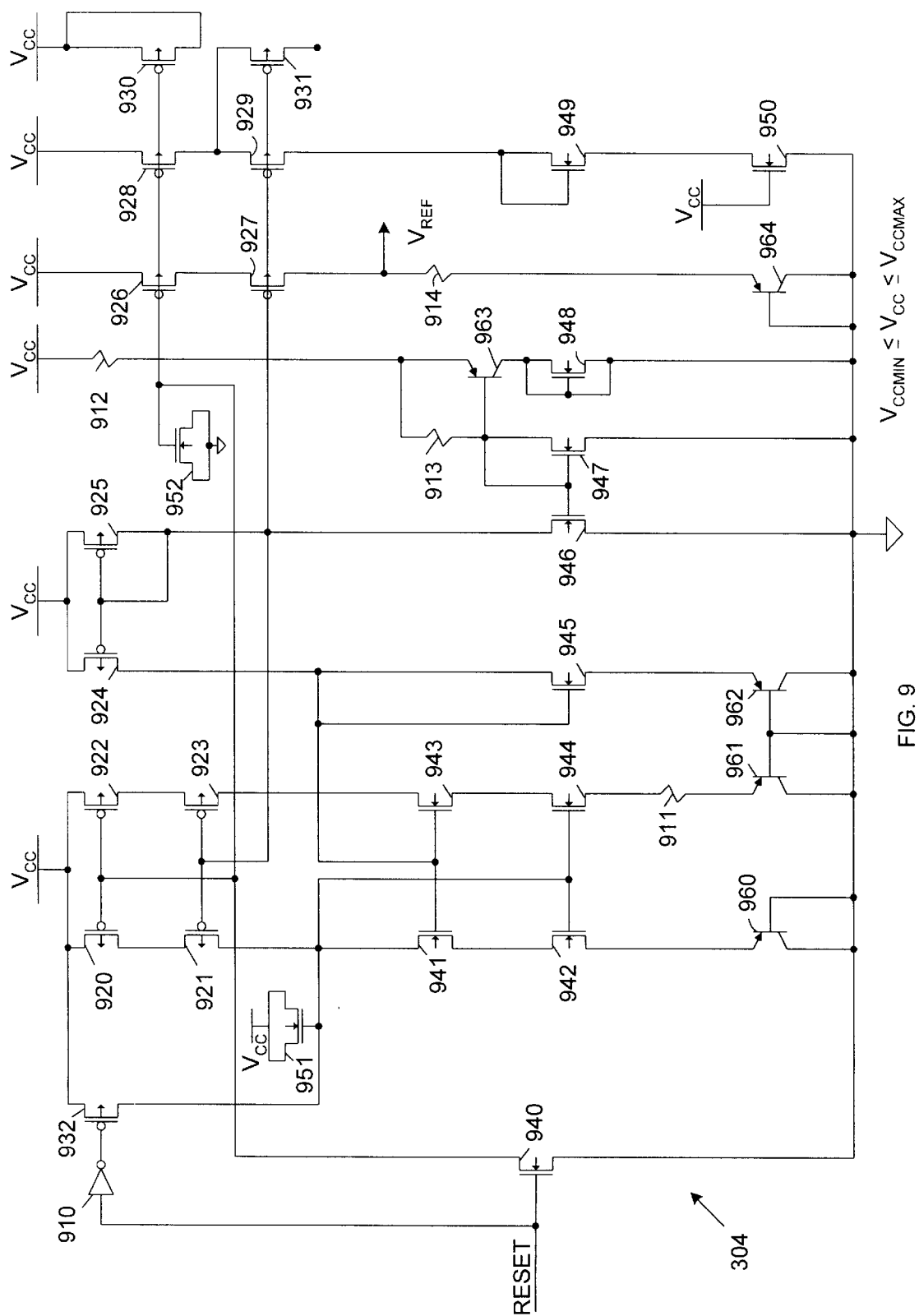
FIG. 9 is a circuit diagram of a reference voltage supply, which is used in the memory circuit of FIG. 5 in one embodiment of the invention.

FIG. 9 is a circuit diagram of reference voltage supply 304 in accordance with one embodiment of the present invention. Reference voltage supply 304 includes inverter 910, resistors 911–914, p-channel FETs 920–932, n-channel FETs 940–950, capacitor-coupled n-channel FETs 951–952, and PNP bipolar transistors 960–964. In this embodiment, the reference voltage supply 304 is a conventional band gap reference regulator. Band gap reference regulators are typically used to generate the band gap voltage reference in emitter coupled logic (ECL) circuits. The band gap regulator circuit generates a reference voltage $V_{REF}$ that is independent of $V_{CC}$ supply voltage and temperature. The band gap regulator circuit generates a reference voltage $V_{REF}$ that is referenced to the ground supply voltage.

The reference voltage $V_{REF}$ generated by reference voltage supply 304 is selected to correspond to one third of the desired boosted word line voltage. For example, if the desired boosted word line voltage $V_{PP}$ is equal to 3.6 Volts, then the reference voltage $V_{REF}$ is selected to be 1.2 Volts. The reference voltage $V_{REF}$ is constant, regardless of variations in the $V_{CC}$ supply voltage and temperature. As a result, the boosted word line voltage $V_{PP}$ is also constant regardless of variations in the $V_{CC}$ supply voltage and temperature.

In general, the band gap regulator circuit 304 operates as follows. The RESET signal applied to inverter 910 and n-channel FET 940 has a logic low value during normal operation. As a result, p-channel FET and n-channel FET 940 are turned off. The gates of n-channel FETs 942–944 are thereby coupled to the $V_{CC}$ supply voltage through capacitor-coupled n-channel FET 951. The gates of p-channel FETs 920, 922 and 926 are coupled to the ground supply voltage through capacitor-coupled n-channel FET 952. P-channel FETs 921 and 923 and n-channel FETs 941 and 943 are biased by the circuit formed by resistors 912–913, n-channel FETs 945–948, p-channel FETs 924–925 and bipolar transistors 962–963. FETs 920, 921, 941 and 942 are identical to FETs 922, 923, 943 and 944, respectively.

PNP bipolar transistor 961 is sized to be ten times larger than PNP bipolar transistor 960. The size difference between transistors 960 and 961 cause these transistors to have different base-to-emitter voltages ($V_{BE}$). The difference between these base-to-emitter voltages is designated as $\hat{C}V_{BE}$. A current proportional to $\hat{C}V_{BE}$ flows through p-channel FETs 922–923, n-channel FETs 943–944 and resistor 911. As described above, p-channel FETs 920, 922 and 926 are biased by the same signal, and p-channel FETs 921, 923 and 927 are biased by the same signal. As a result, a current mirror circuit exists that causes the current through resistor 911 to be equal to the current through resistor 914. Thus, the current through resistor 914 is proportional to $\hat{C}V_{BE}$. $\hat{C}V_{BE}$ is directly related to temperature. Thus, as the temperature increases, $\hat{C}V_{BE}$ increases. As $\hat{C}V_{BE}$ increases, the current through resistor 914 increases, thereby increasing the voltage drop across resistor 914. As the voltage drop across resistor 914 increases, the reference voltage $V_{REF}$ increases.

Conversely, the base-to-emitter voltage $V_{BE}$ of PNP bipolar transistor 964 is inversely related to the temperature. Thus, as the temperature increases, the base-to-emitter voltage $V_{BE}$ of bipolar transistor 964 decreases, thereby decreasing the reference voltage $V_{REF}$. The various circuit elements of reference voltage circuit 304 are selected such that $V_{REF}$ remains constant as the temperature increases and decreases. That is, for an increase in temperature, the voltage drop across resistor 914 increases by an amount equal to the decrease in the voltage drop across bipolar transistor 964. Moreover, the reference voltage $V_{REF}$ is referenced to the ground supply voltage, thereby rendering the reference voltage $V_{REF}$ insensitive to variations in the $V_{CC}$ supply voltage.

Figure 10:
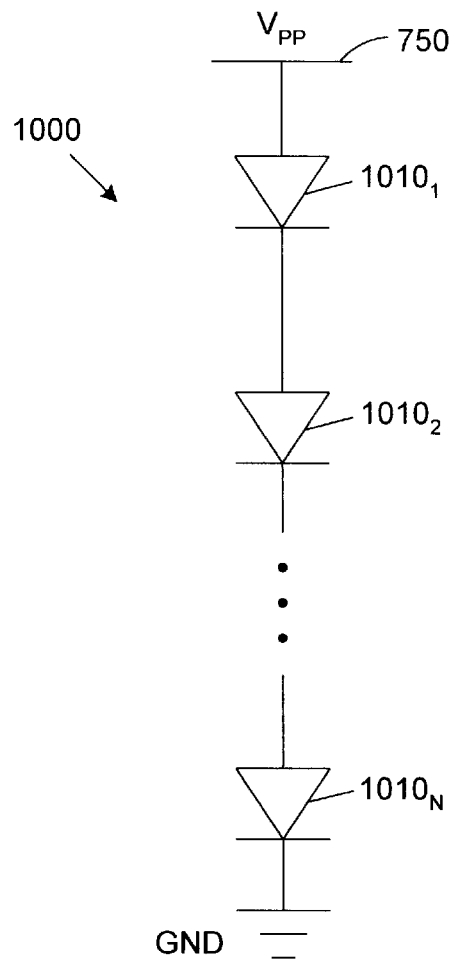
FIG. 10 is a circuit diagram of a voltage clamping circuit, which is used in the memory circuit of FIG. 5 in another embodiment of the invention.
Figure 12:
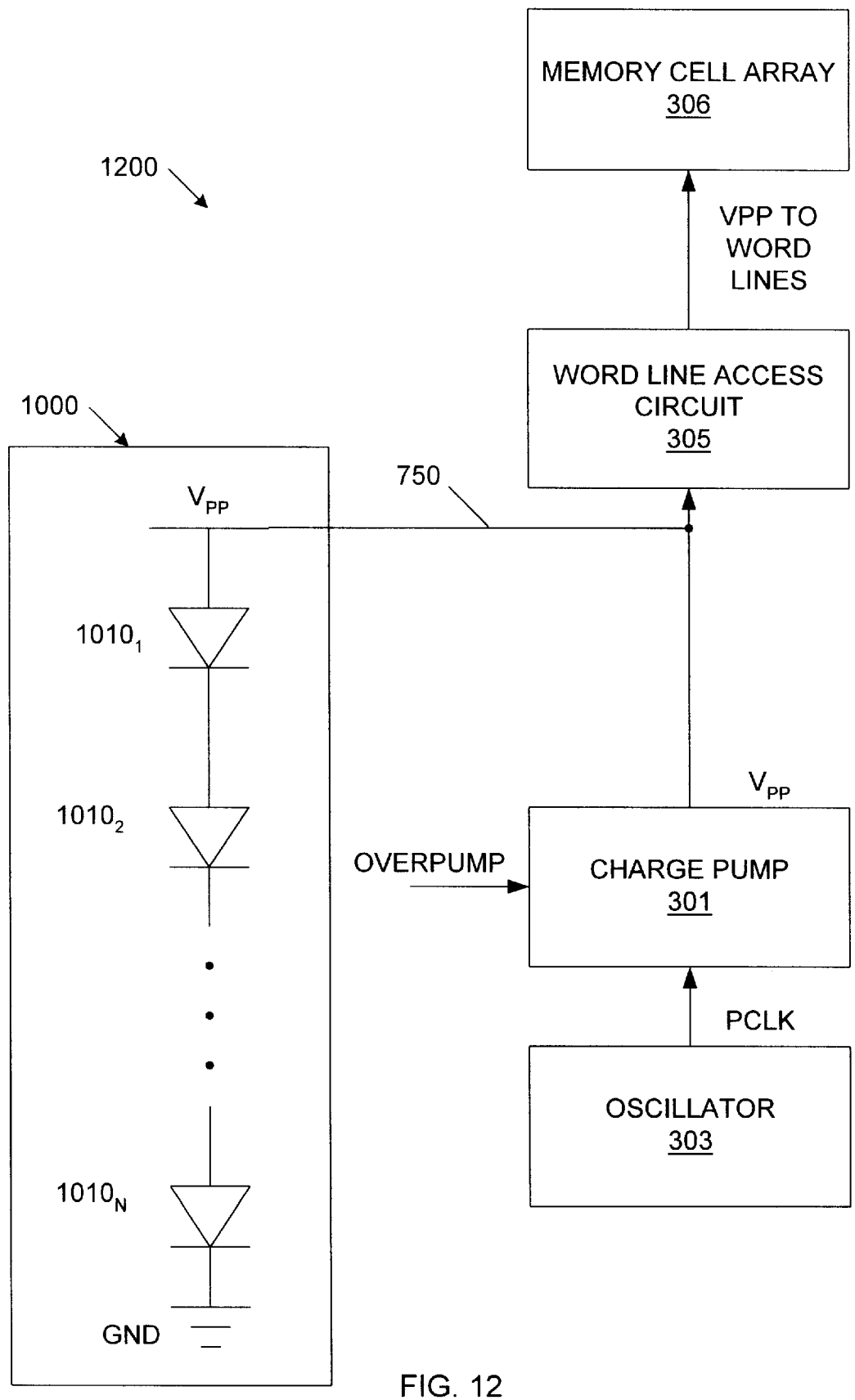
FIG. 12 is a circuit diagram illustrating the voltage clamping circuit of FIG. 10 in a memory circuit in accordance with one embodiment of the present invention.
Figure 13A:
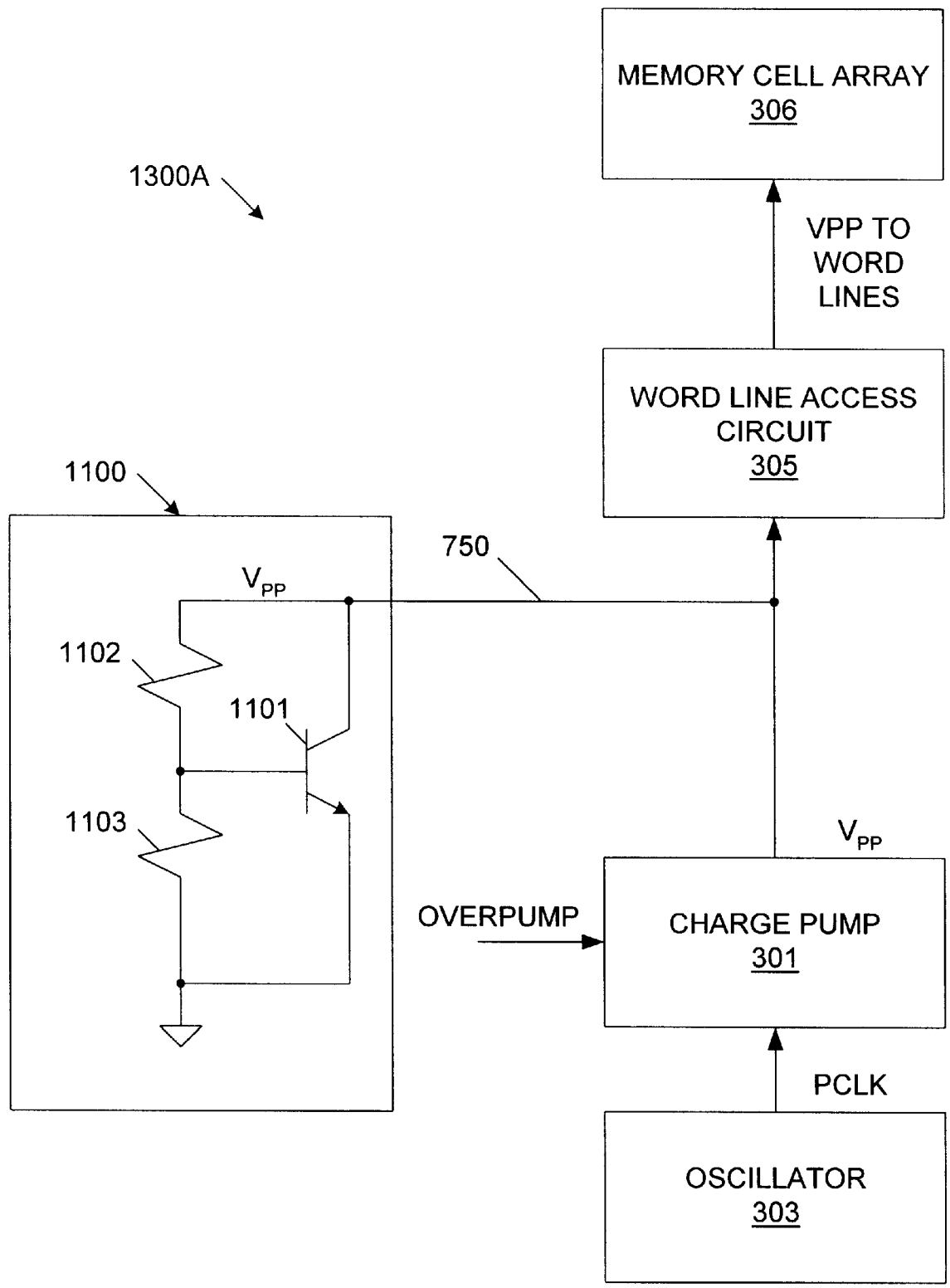
FIGS. 13A–13D are circuit diagrams illustrating the voltage clamping circuits of FIGS. 11A–11D in memory circuits in accordance with other embodiments of the present invention.
Figure 13B:
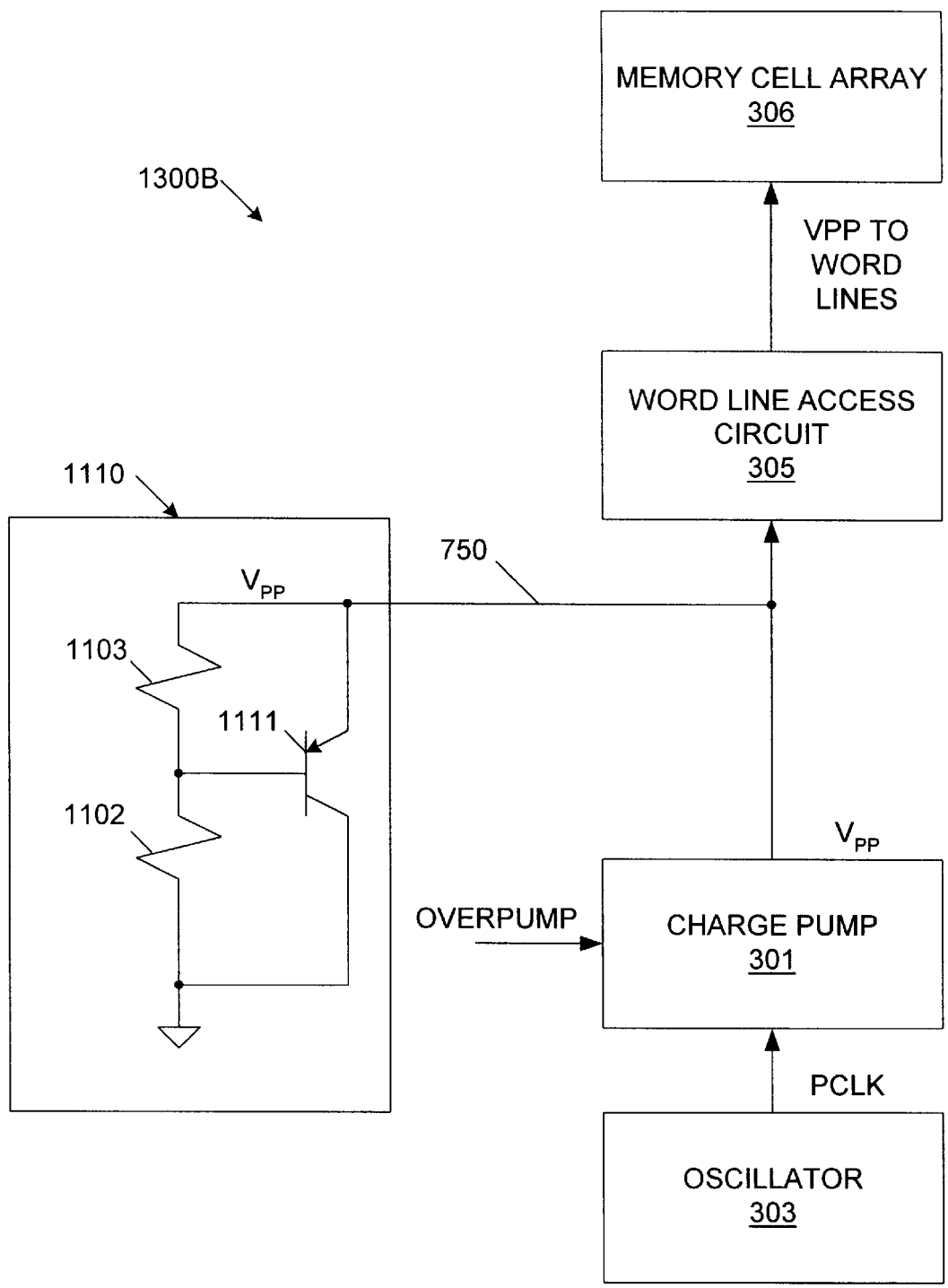
Figure 13C:
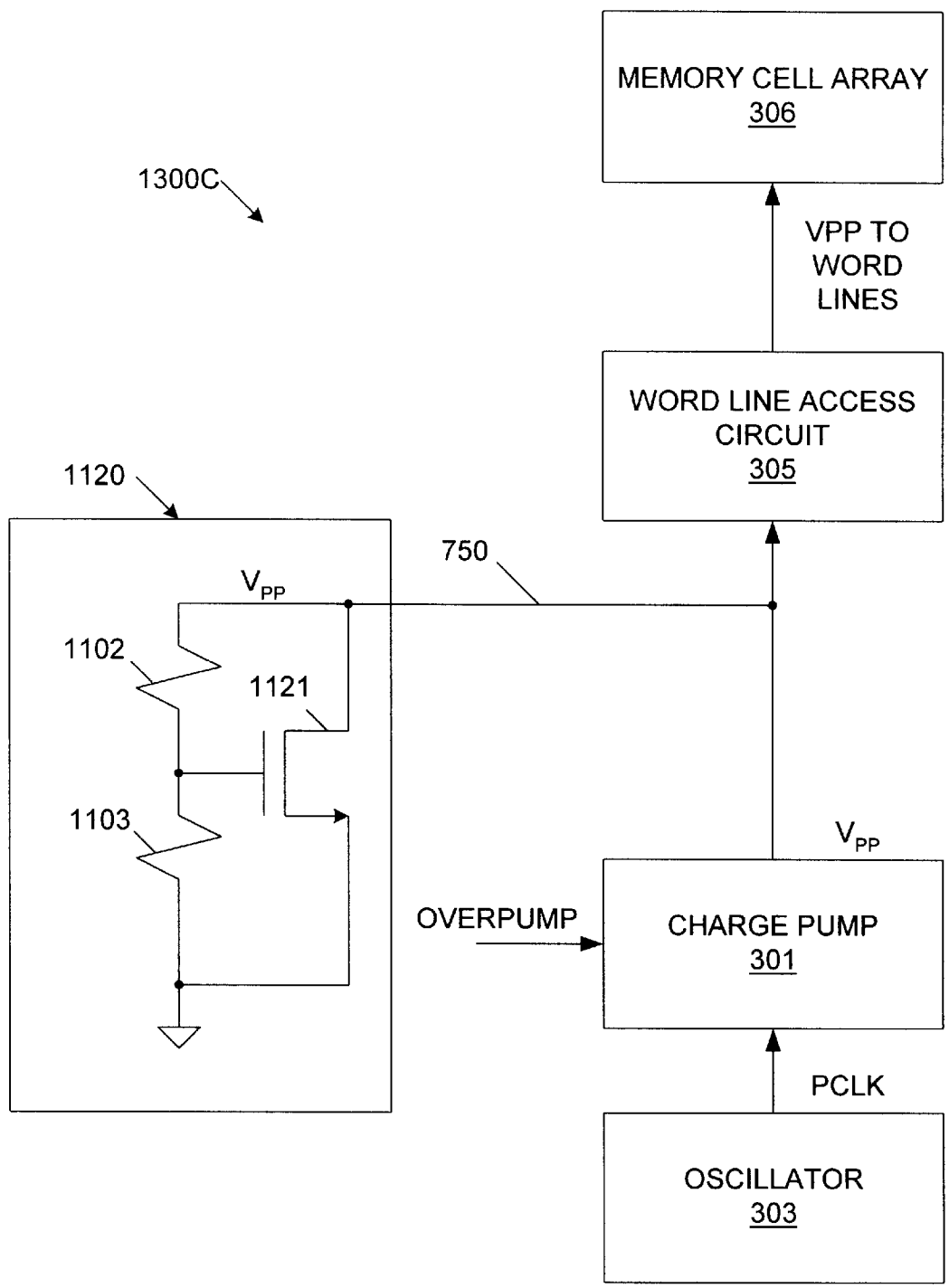
Figure 13D:
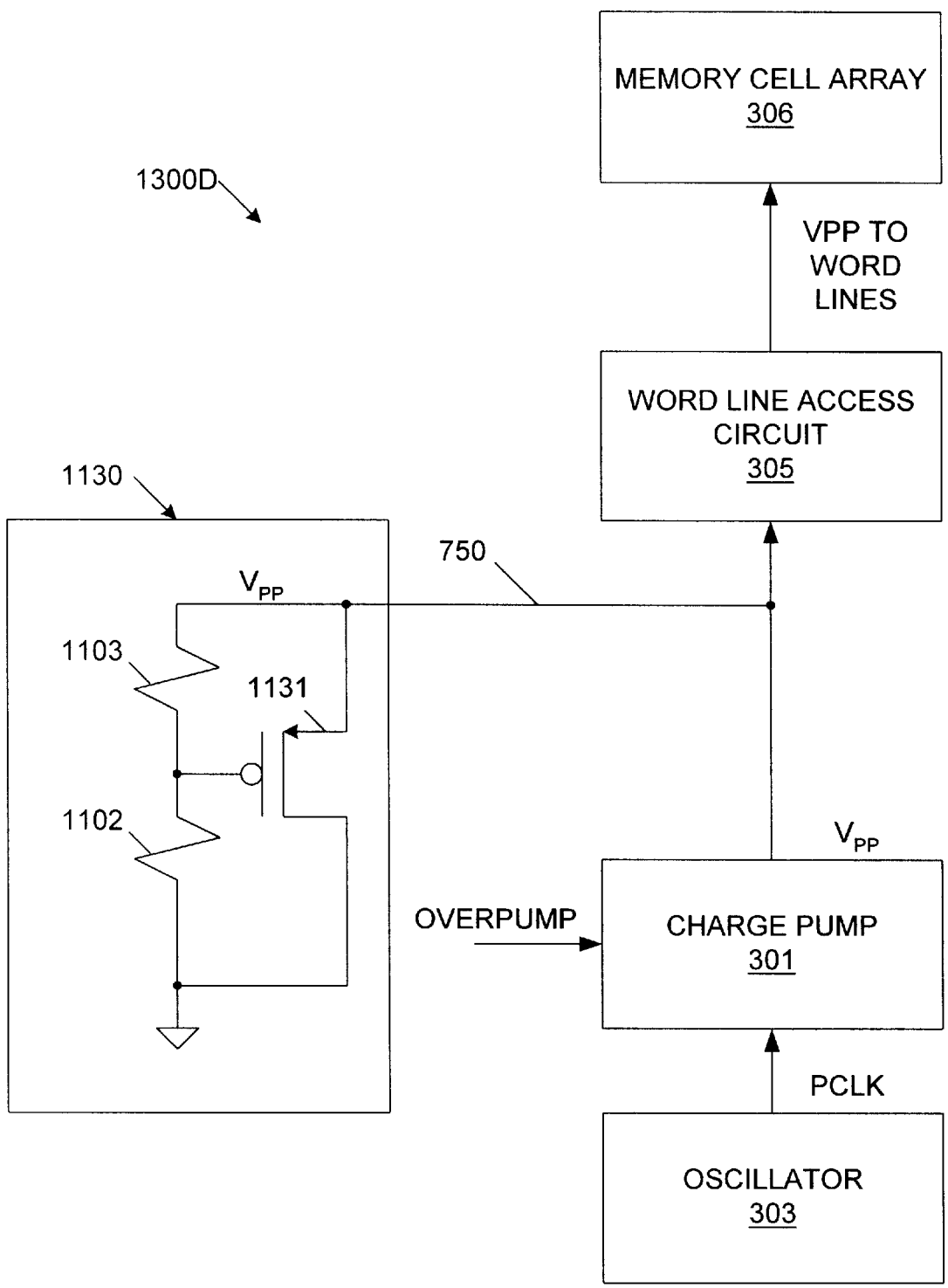

FIG. 10 is a circuit diagram of a voltage clamping circuit 1000 that is used in place of reference voltage supply 304 and pump control circuit 302 in accordance with another embodiment of the present invention. In this embodiment, voltage clamping circuit 1000 voltage supply 304 includes a plurality of diodes $1010_1$–$1010_N$, that are coupled between the $V_{PP}$ bus 750 and the ground voltage supply terminal. Diodes $1010_1$–$1010_N$ are connected such that they are forward biased. The forward voltage drop across each of diodes $1010_1$–$1010_N$ is approximately 0.7 Volts. The number of diodes N is selected such that the sum of the forward voltage drops of diodes $1000_1$–$1000_N$ is equal to the desired boosted word line voltage $V_{PP}$. For example, to achieve a boosted word line voltage $V_{PP}$ of 5.6 Volts, eight diodes are connected in series (i.e., N=8). Charge pump circuit 301 is controlled to over-pump diodes $1010_1$–$1010_N$, such that the full forward voltage drop appears across each of the diodes $1010_1$–$1010_N$. Although voltage clamp circuit 1000 has been described as a series-connected chain of diodes, it is understood that other voltage clamping circuits will provide similar results. FIG. 12 is a circuit diagram illustrating voltage clamping circuit 1000 connected in a memory circuit 1200 in accordance with one embodiment of the present invention.

Figure 11A:
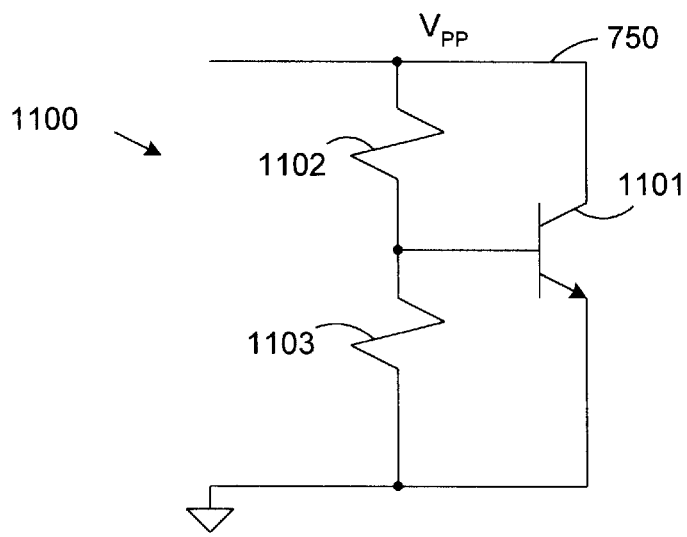
FIGS. 11A, 11B, 11C and 11D are circuit diagrams of voltage clamping circuits in accordance with other embodiments of the present invention.

FIG. 11A is a circuit diagram of a voltage clamping circuit 1100 that can be used in another embodiment of the present invention. Voltage clamping circuit 1100 includes NPN bipolar transistor 1101 and resistors 1102 and 1103. Resistors 1102 and 1103 are connected in series between $V_{PP}$ bus 750 and the ground supply voltage. The base of bipolar transistor 1101 is connected to the node connecting resistors 1102 and 1103. The collector of bipolar transistor 1101 is connected to $V_{PP}$ bus 750 and the emitter of transistor 1101 is connected to the ground supply voltage. As a result, the voltage on $V_{PP}$ bus 750 is clamped at $V_{BE} \times (1+(R_{1102}/R_{1103}))$, where $V_{BE}$ is the base-to-emitter voltage of bipolar transistor 1101, and $R_{1102}$ and $R_{1103}$ are the resistances of resistors 1102 and 1103, respectively. By properly selecting the sizes of bipolar transistor 1101 and resistors 1102–1103, the values of $V_{BE}$ $R_{1102}$, and $R_{1103}$ can be selected to provide the desired value of $V_{PP}$.

Figure 11B:
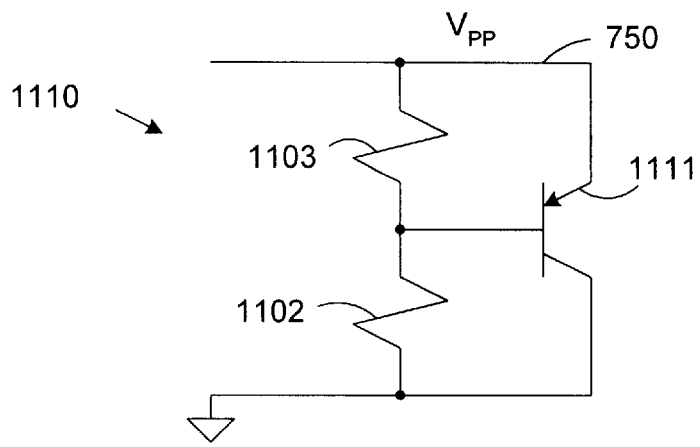

FIG. 11B is a circuit diagram of a voltage clamping circuit 1110 in accordance with another embodiment of the present invention. Voltage clamping circuit 1110 includes PNP bipolar transistor 1111 and resistors 1102 and 1103. Resistors 1102 and 1103 are connected in series $V_{PP}$ bus 750 and the ground supply voltage. The base of bipolar transistor 1111 is connected to the node connecting resistors 1102 and 1103. The emitter of bipolar transistor 1111 is connected to $V_{PP}$ bus 750 and the collector of transistor 1111 is connected to the ground supply voltage. As a result, the voltage on $V_{PP}$ bus 750 is clamped at $V_{BE} \times (1+(R_{1102}/R_{1103}))$, where $V_{BE}$ is the base-to-emitter voltage of bipolar transistor 1111, and $R_{1102}$ and $R_{1103}$ are the resistances of resistors 1102 and 1103, respectively. By properly selecting the sizes of bipolar transistor 1111 and resistors 1102–1103, the values of $V_{BE}$ $R_{1102}$, and $R_{1103}$ can be selected to provide the desired value of $V_{PP}$.

Figure 11C:
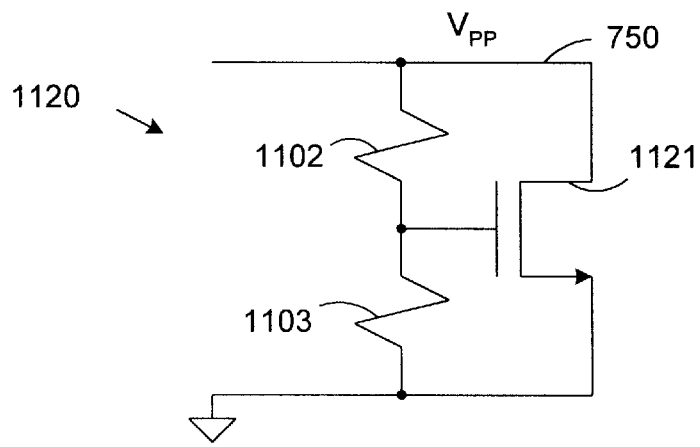

FIG. 11C is a circuit diagram of a voltage clamping circuit 1120 in accordance with another embodiment of the present invention. Voltage clamping circuit 1120 includes n-channel FET 1121 and resistors 1102 and 1103. Resistors 1102 and 1103 are connected in series $V_{PP}$ bus 750 and the ground supply voltage. The gate of n-channel FET 1121 is connected to the node connecting resistors 1102 and 1103. The drain of n-channel FET 1121 is connected to $V_{PP}$ bus 750 and the source of n-channel FET 1121 is connected to the ground supply voltage. As a result, the voltage on $V_{PP}$ bus 750 is clamped at $V_T \times (1+(R_{1102}/R_{1103}))$, where $V_T$ is the threshold voltage of n-channel FET 1121, and $R_{1102}$ and $R_{1103}$ are the resistances of resistors 1102 and 1103, respectively. By properly selecting the sizes of n-channel FET 1121 and resistors 1102–1103, the values of $V_T$ $R_{1102}$, and $R_{1103}$ can be selected to provide the desired value of $V_{PP}$.

Figure 11D:
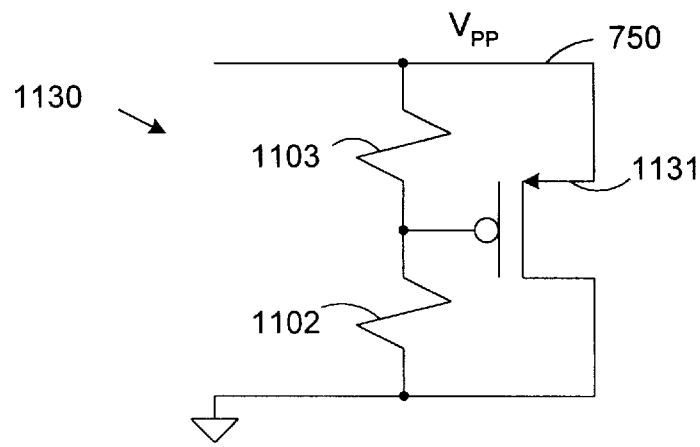

FIG. 11D is a circuit diagram of a voltage clamping circuit 1130 in accordance with another embodiment of the present invention. Voltage clamping circuit 1130 includes p-channel FET 1131 and resistors 1102 and 1103. Resistors 1102 and 1103 are connected in series $V_{PP}$ bus 750 and the ground supply voltage. The gate of p-channel FET 1131 is connected to the node connecting resistors 1102 and 1103. The drain of p-channel FET 1131 is connected to $V_{PP}$ bus 750 and the source of p-channel FET 1131 is connected to the ground supply voltage. As a result, the voltage on $V_{PP}$ bus 750 is clamped at $V_T \times (1+(R_{1102}/R_{1103}))$, where $V_T$ is the threshold voltage of p-channel FET 1131, and $R_{1102}$ and $R_{1103}$ are the resistances of resistors 1102 and 1103, respectively. By properly selecting the sizes of p-channel FET 1131 and resistors 1102–1103, the values of $V_T$ $R_{1102}$, and $R_{1103}$ can be selected to provide the desired value of $V_{PP}$. FIGS. 13A, 13B, 13C and 13D are circuit diagrams illustrating voltage clamping circuits 1100, 1110, 1120 and 1130, respectively, connected in memory circuits 1300A, 1300B, 1300C and 1300D, respectively, in accordance with particular embodiments of the present invention.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A memory circuit that operates in response to a first supply voltage and a ground voltage, the first supply voltage varying between a minimum supply voltage and a maximum supply voltage during normal operating conditions of the memory circuit, the memory circuit comprising:

a memory cell array having a plurality of word lines;

a word line voltage generation circuit that generates a fixed word line voltage equal to the maximum supply voltage, provided that the first supply voltage is maintained between the minimum supply voltage and the maximum supply voltage; and a word line access circuit for selectively transmitting the fixed word line voltage to the word lines.

2. The memory circuit of claim 1, wherein the word line voltage generation circuit comprises a reference voltage supply that generates a reference voltage.

3. The memory circuit of claim 2, wherein the reference voltage supply is referenced to the ground supply voltage.

4. The memory circuit of claim 2, wherein the reference voltage supply comprises a band gap reference regulator.

5. The memory circuit of claim 2, wherein the word line voltage generation circuit further comprises:

an oscillator that generates a clock signal;

a charge pump coupled to receive the clock signal from the oscillator, the charge pump generating the word line voltage in response to the clock signal;

a charge pump control circuit coupled to receive the word line voltage generated by the charge pump and the reference voltage generated by the reference voltage supply, the charge pump control circuit generating a control signal for enabling the charge pump when the word line voltage is less than the reference voltage.

6. The memory circuit of claim 1, wherein the word line voltage generation circuit comprises:

an oscillator that generates a clock signal;

a charge pump coupled to receive the clock signal from the oscillator, the charge pump generating the word line voltage in response to the clock signal; and a voltage clamping circuit coupled to the charge pump, wherein the voltage clamping circuit clamps the word line voltage at the fixed word line voltage.

7. The memory circuit of claim 6, wherein the voltage clamping circuit comprises a plurality of series-connected diodes.

8. The memory circuit of claim 6, wherein the voltage clamping circuit comprises:

a $V_{PP}$ voltage bus coupled to the charge pump circuit;

a first resistor coupled between the $V_{PP}$ voltage bus and a first node;

a second resistor coupled between the first node and a ground voltage terminal; and a bipolar transistor having a collector and an emitter connected across the $V_{PP}$ voltage bus and the ground voltage terminal, and a base coupled to the first node.

9. The memory circuit of claim 6, wherein the voltage clamping circuit comprises:

a $V_{PP}$ voltage bus coupled to the charge pump circuit;

a first resistor coupled between the $V_{PP}$ voltage bus and a first node;

a second resistor coupled between the first node and a ground voltage terminal; and a field effect transistor having a drain and a source connected across the $V_{PP}$ voltage bus and the ground voltage terminal, and a gate coupled to the first node.

10. The memory circuit of claim 1, wherein the memory cell array comprises a plurality of SRAM memory cells.

11. A method of operating a memory circuit response to a first supply voltage and a ground voltage, the first supply voltage varying between a minimum supply voltage and a maximum supply voltage during normal operating conditions of the memory circuit, the method comprising the steps of:

generating a fixed word line voltage equal to the maximum supply voltage, wherein the fixed word line voltage is referenced to a ground voltage; and applying the fixed word line voltage to selected word lines of a memory cell array.

12. The method of claim 11, wherein the step of generating the fixed word line voltage is performed by a band gap reference regulator.

13. The method of claim 11, wherein the step of generating the fixed word line voltage is performed by a voltage clamping circuit.

14. The method of claim 11, wherein the step of generating the fixed word line voltage comprises the steps of:

generating a clock signal;

generating a word line voltage with a charge pump in response to the clock signal;

generating a reference voltage equal to a predetermined fraction of the desired fixed word line voltage;

comparing the word line voltage and the reference voltage;

enabling the charge pump when the word line voltage times the pre-determined fraction is less than the reference voltage; and disabling the charge pump when the word line voltage times the pre-determined fraction is greater than the reference voltage, whereby the word line voltage is forced to the fixed word line voltage.

* * * * *